US010248592B2

(12) United States Patent
Mirichigni et al.

(10) Patent No.: US 10,248,592 B2
(45) Date of Patent: *Apr. 2, 2019

(54) INTERRUPTED WRITE OPERATION IN A SERIAL INTERFACE MEMORY WITH A PORTION OF A MEMORY ADDRESS

(71) Applicant: Micron Technology, Inc., Boise, ID (US)

(72) Inventors: Graziano Mirichigni, Vimercate (IT); Daniele Vimercati, El Dorado Hills, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/225,562

(22) Filed: Aug. 1, 2016

(65) Prior Publication Data

US 2017/0031851 A1  Feb. 2, 2017

Related U.S. Application Data

(63) Continuation of application No. 14/171,630, filed on Feb. 3, 2014, now Pat. No. 9,442,867, which is a
(Continued)

(51) Int. Cl.
*G06F 12/00* (2006.01)
*G06F 13/24* (2006.01)
*G11C 5/06* (2006.01)
*G11C 7/22* (2006.01)
*G11C 13/00* (2006.01)
(Continued)

(52) U.S. Cl.
CPC ............ *G06F 13/24* (2013.01); *G06F 3/0611* (2013.01); *G06F 3/0659* (2013.01); *G06F 3/0683* (2013.01); *G06F 12/0253* (2013.01); *G11C 5/066* (2013.01); *G11C 7/22* (2013.01); *G11C 13/0004* (2013.01); *G11C 13/004* (2013.01); *G11C 13/0061* (2013.01); *G11C 13/0069* (2013.01); *G06F 2212/702* (2013.01); *G11C 2207/2209* (2013.01); *G11C 2216/22* (2013.01)

(58) Field of Classification Search
CPC .... G06F 13/24; G06F 12/0253; G06F 3/0683; G06F 3/0611; G06F 3/0659; G06F 2212/702; G11C 5/066; G11C 13/0004; G11C 13/004; G11C 13/0061; G11C 13/0069; G11C 7/22; G11C 2207/2209; G11C 2216/22
USPC ............. 711/150, 160, 218, 168; 365/189.04
See application file for complete search history.

(56) References Cited

U.S. PATENT DOCUMENTS 5,663,922 A 9/1997 Tailliet
6,477,101 B2 11/2002 Cavaleri et al.
(Continued)

FOREIGN PATENT DOCUMENTS

CN 101882468 A 11/2010
JP H 1173773 3/1999

OTHER PUBLICATIONS

Chinese Patent Office; Office Action dated Mar. 26, 2014, from Chinese Patent Application No. 201110370055.8.
(Continued)

*Primary Examiner* — Hong C Kim
(74) *Attorney, Agent, or Firm* — Holland & Hart LLP

(57) ABSTRACT

Subject matter disclosed herein relates to read and write processes of a memory device.

20 Claims, 7 Drawing Sheets

Related U.S. Application Data continuation of application No. 12/947,781, filed on Nov. 16, 2010, now Pat. No. 8,645,637.

(51) Int. Cl.
*G06F 3/06* (2006.01)
*G06F 12/02* (2006.01)

(56) References Cited

U.S. PATENT DOCUMENTS

| | | |
|---|---|---|
| 7,529,145 B2 | 5/2009 | La Rosa et al. |
| 7,881,145 B2 | 2/2011 | Lee et al. |
| 8,149,643 B2 | 4/2012 | Tzou et al. |
| 8,645,637 B2 | 2/2014 | Mirichigni et al. |
| 2001/0021117 A1* | 9/2001 | Cavaleri .................. G11C 7/10 365/1 |
| 2006/0067129 A1* | 3/2006 | La Rosa .................. G11C 7/12 365/185.21 |
| 2009/0303807 A1* | 12/2009 | Lee ......................... G11C 7/22 365/191 |

OTHER PUBLICATIONS

Japanese Patent Office; Office Action of Japanese Application No. 2011-224349; dated Jan. 15, 2013.

NUMONYX, 128-Mbit, 1.8V, multiple I/O, 4-Kbyte subsector erase on boot sectors, Xip enabled, serial flash memory with 108 MHz SPI bus interface, www.numonyx.com, Feb. 2010, 185 pages.

Taiwanese Patent Office; Office Action dated Aug. 25, 2014, from related Taiwanese Patent Application No. 100137015.

USPTO; Office Action dated Sep. 24, 2012, from related U.S. Appl. No. 12/947,781.

USPTO; Office Action dated Mar. 11, 2013, from related U.S. Appl. No. 12/947,781.

* cited by examiner

INTERRUPTED WRITE OPERATION IN A SERIAL INTERFACE MEMORY WITH A PORTION OF A MEMORY ADDRESS

CROSS-REFERENCE TO RELATED APPLICATION

The present application for Patent claims priority to and is a continuation of U.S. patent application Ser. No. 14/171,630 by Mirichigni et al., entitled "Interrupted Write Memory Operation in a Serial Interface Memory with a Portion of a Memory Address," filed Feb. 3, 2014, which is a continuation of U.S. patent application Ser. No. 12/947,781 by Mirichigni et al., entitled "Interruption of Write Memory Operations to Provide Faster Read Access in a Serial Interface Memory," filed Nov. 16, 2010, assigned to the assignee hereof, and expressly incorporated by reference herein.

BACKGROUND

Field

Subject matter disclosed herein relates to read and write processes of a memory device.

Information

Memory devices are employed in many types of electronic devices, such as computers, cell phones, PDA's, data loggers, and navigational equipment, just to name a few examples. Among such electronic devices, various types of nonvolatile memory devices may be employed, such as NAND or NOR flash memories, SRAM, DRAM, and phase-change memory, just to name a few examples. In general, writing or programming processes may be used to store information in such memory devices, while a read process may be used to retrieve stored information.

Some types of memory devices comprise a memory cell array partitioned into groups of memory cells, such as sectors, partitions, and so on. In such cases, memory cells within such a group may share common electronic circuitry including sense amplifiers, and row/column decoders, for example. Accordingly, both reading from and writing to such a group of memory cells may involve some common electronic circuitry. In such a case, a pending write operation occurring in one portion of such a group of memory cells may prevent a read operation from occurring in another portion of the same group of memory cells. Such a limiting condition may result in slower read operations and overall reduced performance of a memory device.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
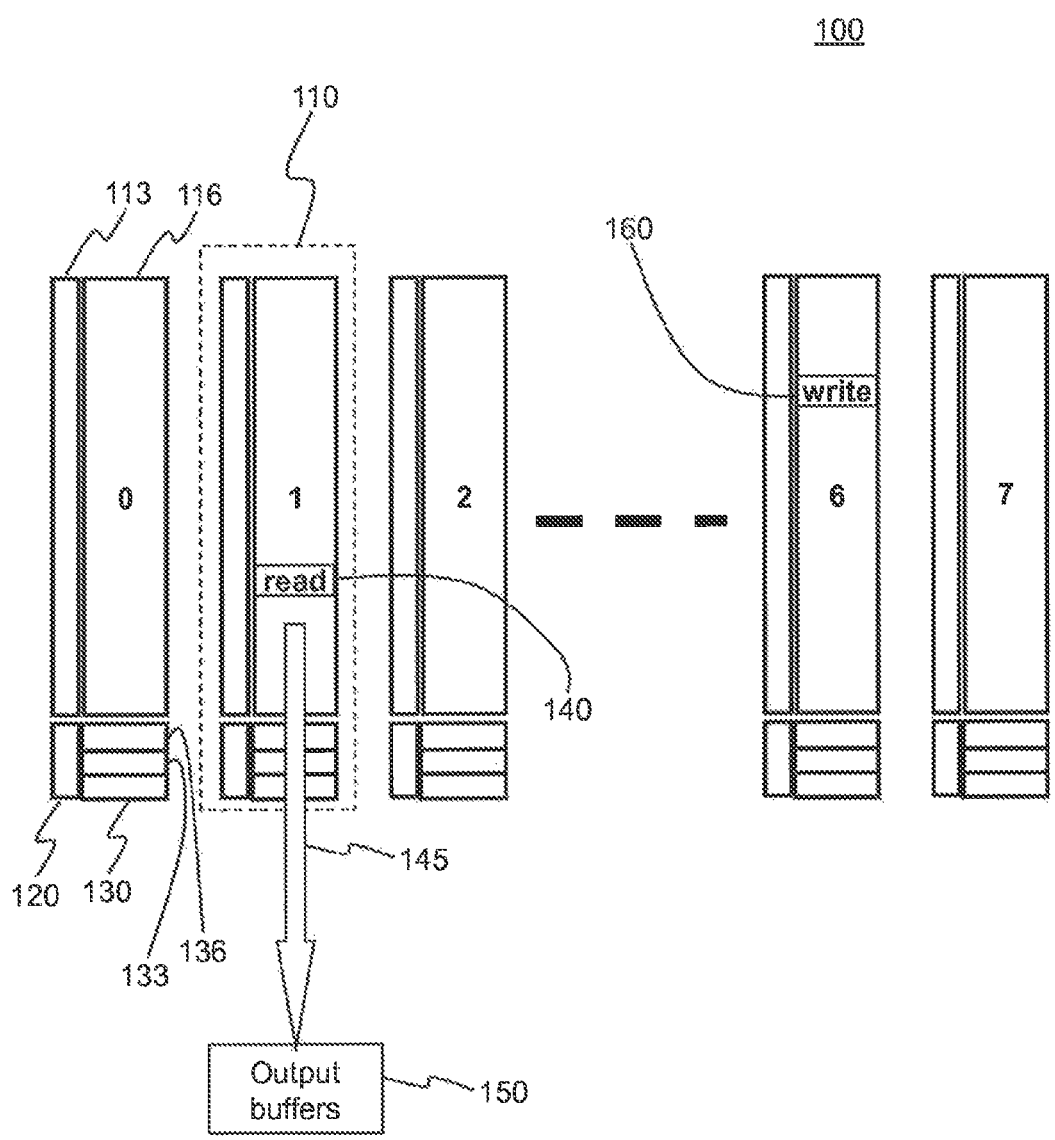
FIGS. 1-2 are schematic diagrams of a portion of memory, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a memory device, which may comprise a phase change memory (PCM) device, for example, may include a memory array partitioned into groups of memory cells called partitions. Such a memory device may comprise a serial interface memory. Examples of applications of a serial interface memory may include printers, multimedia cards, DVD players, set top boxes, digital cameras, hard disk drives (HDDs), automotive applications, mobile phones, and so on Such a serial interface memory is not to be confused with a generic serial memory that may comprise magnetic tape, for example. Memory cells within partitions may share common electronic circuitry including sense amplifiers, and row/column decoders, for example. In an implementation, such a memory device may include a microcontroller to perform an operation to read from a particular partition while a write operation is occurring in the same particular partition of a memory array. Techniques performed by such a microcontroller may include serially receiving a read command that includes a command code and an address, for example. Such an address may be received starting with a most-significant bit (MSB) of the address and ending with the least-significant bit (LSB). Depending on a particular implementation, several MSBs of the address may comprise sufficient information to determine which partition includes the memory location targeted by the read command. Accordingly, after serially receiving several MSBs of the address, the microcontroller may determine whether a write operation is occurring in the same particular partition. If it is determined that a write operation is not occurring in the same partition, then the microcontroller may immediately perform the read operation. If a write operation is occurring, however, then the microcontroller may first begin to interrupt the write operation before beginning the read operation. At a later time, the microcontroller may resume the write operation after the read operation is completed. In an implementation, the microcontroller may perform such an interrupt of the write operation while continuing to serially receive a remaining portion (e.g., LSBs) of the address of the read command. Accordingly, receiving a read command and interrupting a write operation may be performed concurrently, as explained in detail below. Though embodiments described herein recite a microcontroller as performing various tasks or operations, it is understood that claimed subject matter is not limited to such a microcontroller, and that other circuitry and/or software may carry out such tasks or operations.

In an embodiment, a microcontroller to perform techniques to read from a memory partition by interrupting a write operation, as described above, may be located internally within a memory device, though claimed subject matter is not so limited. For example, a computing system may include a processor to execute applications, a memory device, and a memory controller connected between the processor and the memory device. Such a processor, in response to executing an application for example, may initiate a read command to read from a particular location in the memory device. In response to receiving such a read command, the memory controller may perform a read operation by generating a read command for the memory device and providing the read command serially to the memory device. In such a case, the processor and/or the memory controller need not be aware as to whether a write operation occurring in the memory device may conflict with a read operation (e.g., within a same partition of the memory device). Instead, a microcontroller internal to the memory device may perform a number of processes to allow the read operation to proceed without conflicting with the write operation. Accordingly, a memory controller and/or a processor need not have a burden of monitoring write processes within a memory device to prevent read-write conflicts.

As mentioned above, a processor may execute one or more applications, resulting in operations to read from a memory device or write to the memory device. In an embodiment, however, some write operation may be initiated by a microcontroller during any of a number of internal memory processes. For example, a microcontroller may initiate write operations in one or more partitions of a memory array to perform wear leveling, garbage collection, bad block management, and/or refresh processes. Such processes may comprise background operations not visible to a processor and/or user at an application level, for example. Embodiments described herein may allow such write operations to occur without a need for a memory controller and/or processor to suspend such internal memory processes.

FIG. 1 is a schematic diagram of a portion 100 of memory, according to an embodiment. For example, such a memory may comprise PCM that may be organized in data partitions of memory cells. In following descriptions, such a portion of memory may be described as comprising eight data partitions. Such a particular number of data partitions is merely described for sake of convenience and to simplify explanation and understanding. It is to be understood, however, that the number of data partitions involved in embodiments described herein is not limited to any particular number, and claimed subject matter is not limited in this respect. Continuing with the description of FIG. 1, memory portion 100 may include a number (e.g., eight) of data partitions 110. In one implementation, such data partitions may comprise memory cell array 116, row decoder 113, column decoder 136, program loads (PL) 133 (e.g., used during write operations to determine memory cells to be written), one or more sense amplifiers 130, and other circuitry 120 involved in read/write operations of the associated data partition, for example.

Figure 2:
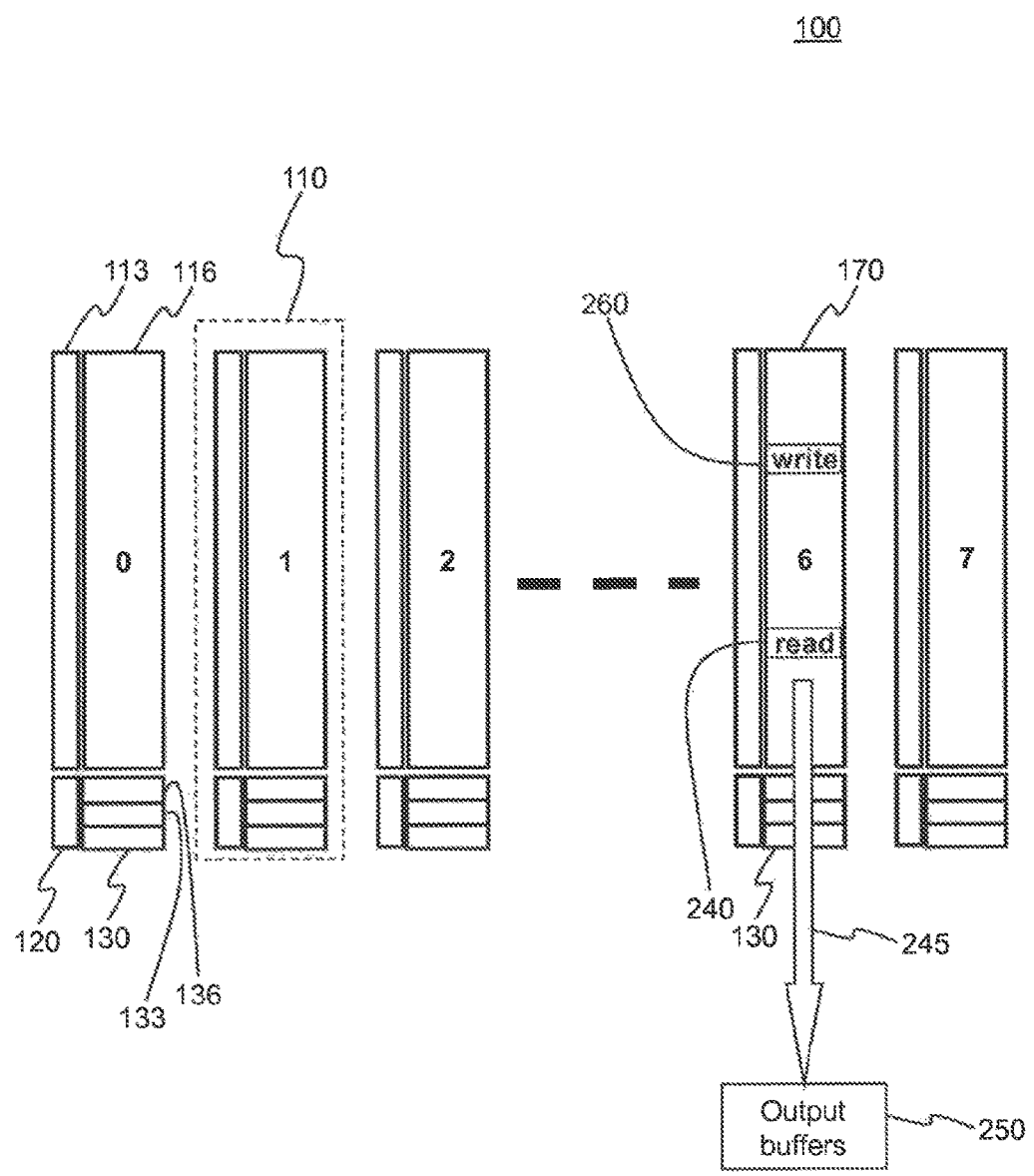

In an implementation, a read operation to directly read from one data partition may occur concurrently with a write operation to write to a different data partition. In such a case, no contention or conflict need occur because, among a number of reasons, such data partitions may include their own read circuitry (e.g., sense amplifiers) and/or row and column decode circuitry, for example. So for a particular example, read operation 140 to directly read from data partition 1 may occur concurrently with write operation 160 to write to data partition 6. Read operation 140 may include a process 145 of measuring states of read memory cells in data partition 1 via sense amplifiers 130 and writing data representative of the states into an output buffer 150, for example FIG. 2 is a schematic diagram of portion 100 of memory, according to another embodiment. As mentioned above, a read operation to directly read from one data partition may occur concurrently with a write operation to write to a different data partition. In a case shown to be occurring in data partition 170, however, a conflict may occur. In particular, read operation 240 to directly read from one block of data partition 6 may not be able to occur concurrently with write operation 260 to write to another block of data partition 6. In one implementation, for example, upon receiving a command (e.g., from an external processor or from a portion of an internal memory controller) to perform read operation 240, write operation 260 may be suspended until read operation 240 is complete. Such a write operation suspension may result from a specific command from a processor and/or a memory controller. In another implementation, a command to perform read operation 240 may be denied and/or delayed until write operation 260 is complete. In either implementation, read operation 240 may include a process 245 of measuring states of read memory cells in partition 6 via sense amplifiers 130 and writing data representative of the states into an output buffer 250, for example.

Figure 3:
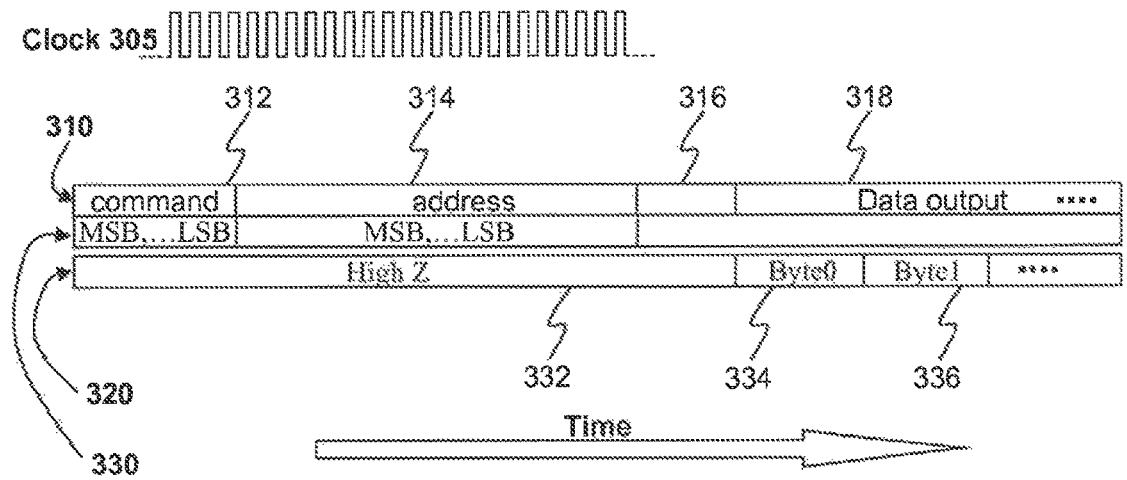
FIGS. 3, 4, 5A and 5B are timing diagrams of a process to read from a partition of memory, according to an embodiment.
Figure 8:
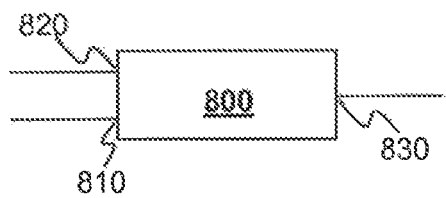
FIG. 8 is a block diagram of a serial interface memory, according to an embodiment.

FIG. 3 is a timing diagram of a process to read from a partition of memory, according to an embodiment. FIG. 8 is a block diagram of a serial interface memory 800, according to an embodiment, that may perform such a process to read from a partition of memory, for example. Serial interface memory 800 may comprise an input port 810 to receive information regarding data, commands, addresses, and so on. Serial interface memory 800 may also comprise an input port 820 to receive a clock signal and an output port to transmit information including read data, for example. Similar to the memory comprising portion 100 described above, such a memory may comprise PCM that may be organized in partitions of memory cells. Row 310 may comprise information serially provided to a microcontroller via port 810 of serial interface memory 800, for example. Here, "serially" means that such information may be received or transmitted by the microcontroller sequentially one bit at a time. In an implementation, such information may be sequentially received based, at least in part, on a clock signal 305 provided to serial interface memory 800 via port 820, for example. In particular, such information may be latched (e.g., stored, received) on a rising edge of clock signal 305. Row 310 may comprise a command code portion 312, an address portion 314, a dummy portion 316, and data output portion 318. As indicated in row 330, command code portion 312 may be provided to a microcontroller in a sequential order starting with the MSB of a command code and ending with the LSB of the command code. Similarly, address portion 314 may be provided to the microcontroller in a sequential order starting with the MSB of an address and ending with the LSB of the address. Row 320 describes information that may be provided by memory, such as contents of a memory partition 334, 336, and so on. Portion 332 may be undefined (e.g., output at high impedance) while the microcontroller receives command code portion 312, address portion 314, and dummy portion 316. In an implementation, command code portion 312 may comprise one or more bits that indicate whether the command comprises a read, write, or erase command, for example. Address portion 314 may comprise a plurality of bits that represent one or more locations of a memory array. In detail, MSBs of address portion 314 may correspond to a relatively coarse description of a memory location, while LSBs may correspond to a relatively fine description of the memory location. For example, one or more MSBs of address portion 314 may describe which partition contains the memory location, while LSBs of address portion 314 may describe the memory location to the nearest memory block and/or minimum group of addressable memory cells. Accordingly, such an implementation of address portion 314 may provide an opportunity to determine which partition includes a particular memory location by merely receiving an MSB portion of an address of the particular memory location, as described in further detail below. Dummy portion 316 may comprise an interval of time to provide a margin of time between receiving a read address (e.g., address portion 314) and data output 318 (e.g., reading memory cells at the address). Of course, such details of timing of a read process are merely examples, and claimed subject matter is not so limited.

Figure 4:
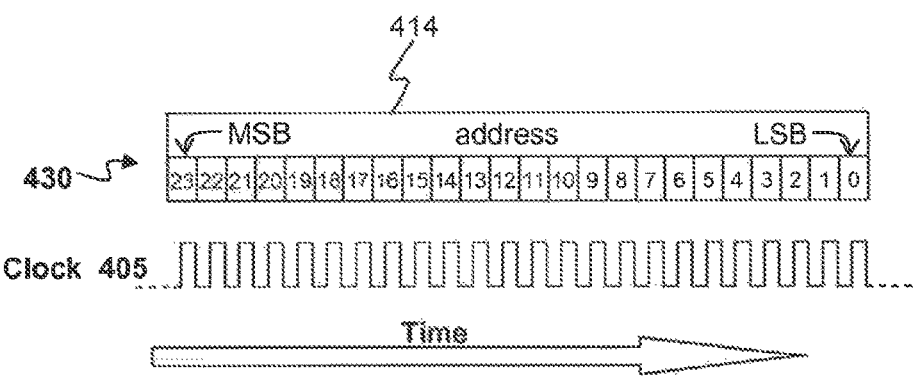

FIG. 4 shows an example of a detailed view of an address portion of the timing diagram shown in FIG. 3, according to an embodiment. In particular, address 414, showing individual bits of an address numbered "0" through "23", may comprise at least a portion of address portion 314. As indicated in the example, address bit "23" may comprise a MSB of address 414 and address bit "0" may comprise a LSB of address 414 for a 128 Mb byte addressable memory (as in the case here, a single memory location may be used to represent a group of cells storing one byte). As described above, address 414 may comprise address bits serially provided, starting with MSB 23 and ending with LSB 0, to a microcontroller of the memory. Such address bits may be serially provided to the microcontroller sequentially one bit at a time based, at least in part, on clock signal 405. In particular, such information may be latched on a rising edge of a clock signal. As described above, MSBs (e.g., bits 23, 22, 21, and so on) of address 414 may correspond to a relatively coarse description of a memory location, while LSBs (e.g., bits 0, 1, 2, 3, and so on) may correspond to a relatively fine description of the memory location. For example, bits 23, 22, and 21 may describe a partition that contains a particular memory location, while remaining bits 20 through 0 may describe the memory location to the nearest group of memory cells that identify one byte.

Figure 5A:
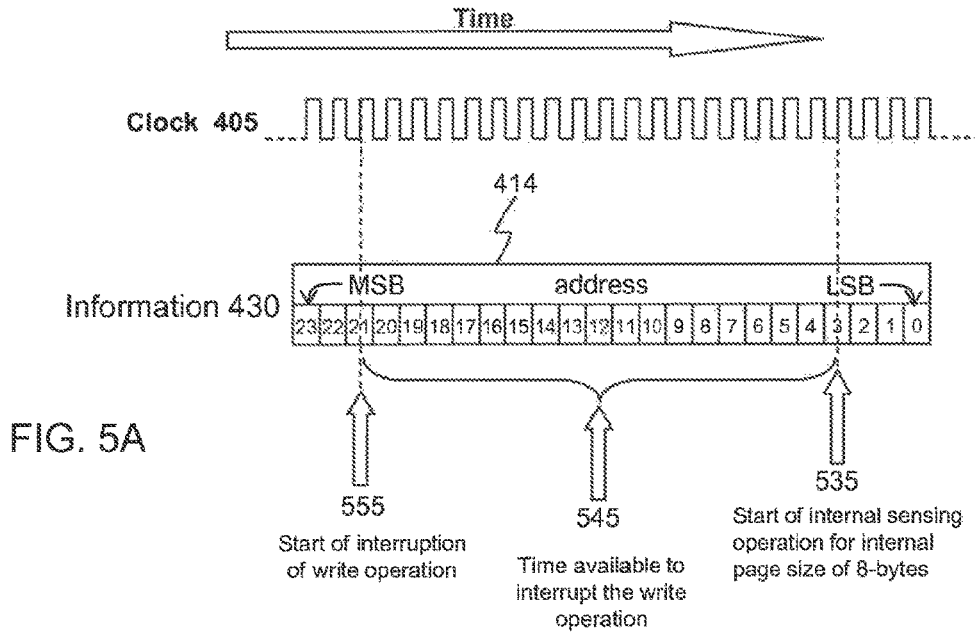
Figure 5B:
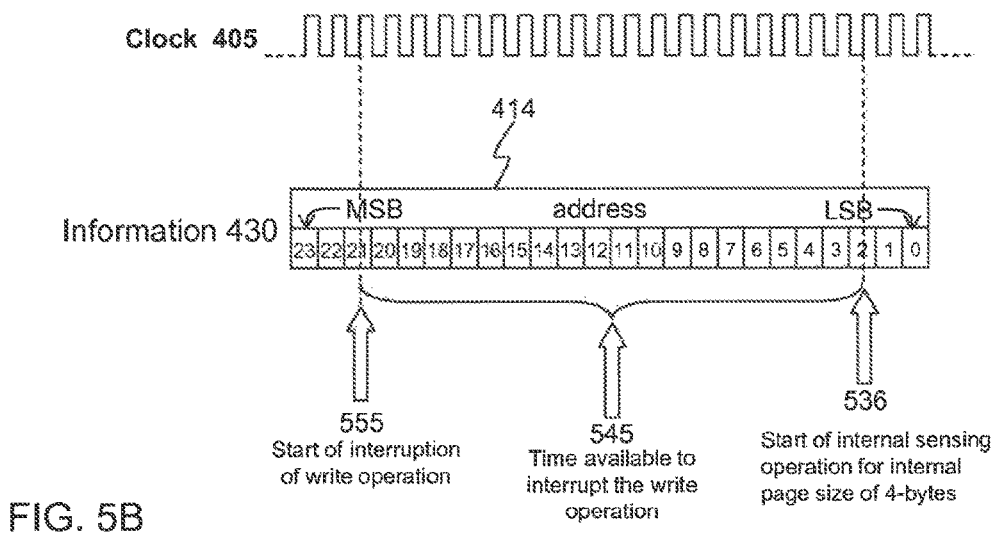

FIGS. 5A and 5B show other detailed views of an address portion of the timing diagram of a read command shown in FIGS. 3 and 4, according to an embodiment. As described above, address 414 may be sequentially provided to a microcontroller one address bit at a time based, at least in part, on clock signal 405. In particular, such information may be latched on a rising edge of a clock signal. In a particular implementation, a clock cycle of clock signal 405 may have a period of about 10 nanoseconds, for example. MSBs (e.g., bits 23, 22, 21, and so on) of address 414 may correspond to a relatively coarse description of a memory location. For example, bits 23, 22, and 21 may describe the partition that contains the target memory location of the read command. In such a case, three of the MSBs may identify one of eight partitions. In another example, two MSBs may be sufficient to identify one of four partitions. In yet another example, four MSBs may be sufficient to identify one of sixteen partitions, and so on. In an implementation described in part by FIGS. 5A and 5B, a memory array may comprise eight partitions, though claimed subject matter is not so limited. Accordingly, subsequent to receiving MSBs 23, 22, 21, a microcontroller may determine if a write operation is occurring in the same partition as that of the target memory location of the read command. If the microcontroller determines that such a write operation is occurring, the microcontroller may begin a process of interrupting the write operation. Such an interrupt process may begin subsequent to receiving bit 21, as indicated by timing arrow 555. Accordingly, such an interrupt process may begin at a relatively early time with respect to the time it takes to receive the remaining bits of the memory address (e.g., bits 20 through 0). Such early determination of which partition includes the target memory location, and whether a write process is occurring in the same partition, may provide a benefit that includes relatively fast read times, as described in more detail below.

An interrupt process started upon receiving bit 21 may take some time to be completed. In an implementation, a time span available to complete an interrupt process may correspond to the time it takes to receive additional bits of the memory address 414, as indicated by timing arrow 545. Accordingly, a microcontroller may perform a concurrent process of receiving the additional bits of memory address 414 and completing a write interrupt. Such a concurrent process may provide a benefit of improved read speed, for example. Upon completion of an interrupt process, one or more processes involved in reading from a memory device may begin. In particular, a read process may include internal sensing operations to detect states or logic levels of one or more memory cells. In one implementation, shown in FIG. 5A, such internal sensing operations may be performed for a page of memory. In a particular example, a page may comprise eight memory bytes. Thus, a read operation of a particular page may be started after having identified the first of four LSBs received by the microcontroller, namely bit 3. In the case shown in FIG. 5A, internal sensing operations may begin as soon as the microcontroller may identify the page that includes the target memory location of the read command, as indicated by arrow 535. As another particular example, shown in FIG. 5B, for a page size of four bytes, a read operation of a particular page may be started after having identified the first of three LSBs received by the microcontroller, namely bit 2. In the case shown in FIG. 5B, internal sensing operations may begin as soon as the microcontroller may identify the page that includes the target memory location of the read command, as indicated by arrow 536. In this example, there may be one more clock cycle available to interrupt a write operation as compared with the previous example. Accordingly, a microcontroller may perform a concurrent process of receiving remaining bits of the memory address and beginning internal sensing operations for read operations. Such a concurrent process may provide a benefit of improved read speed, for example.

Figure 6:
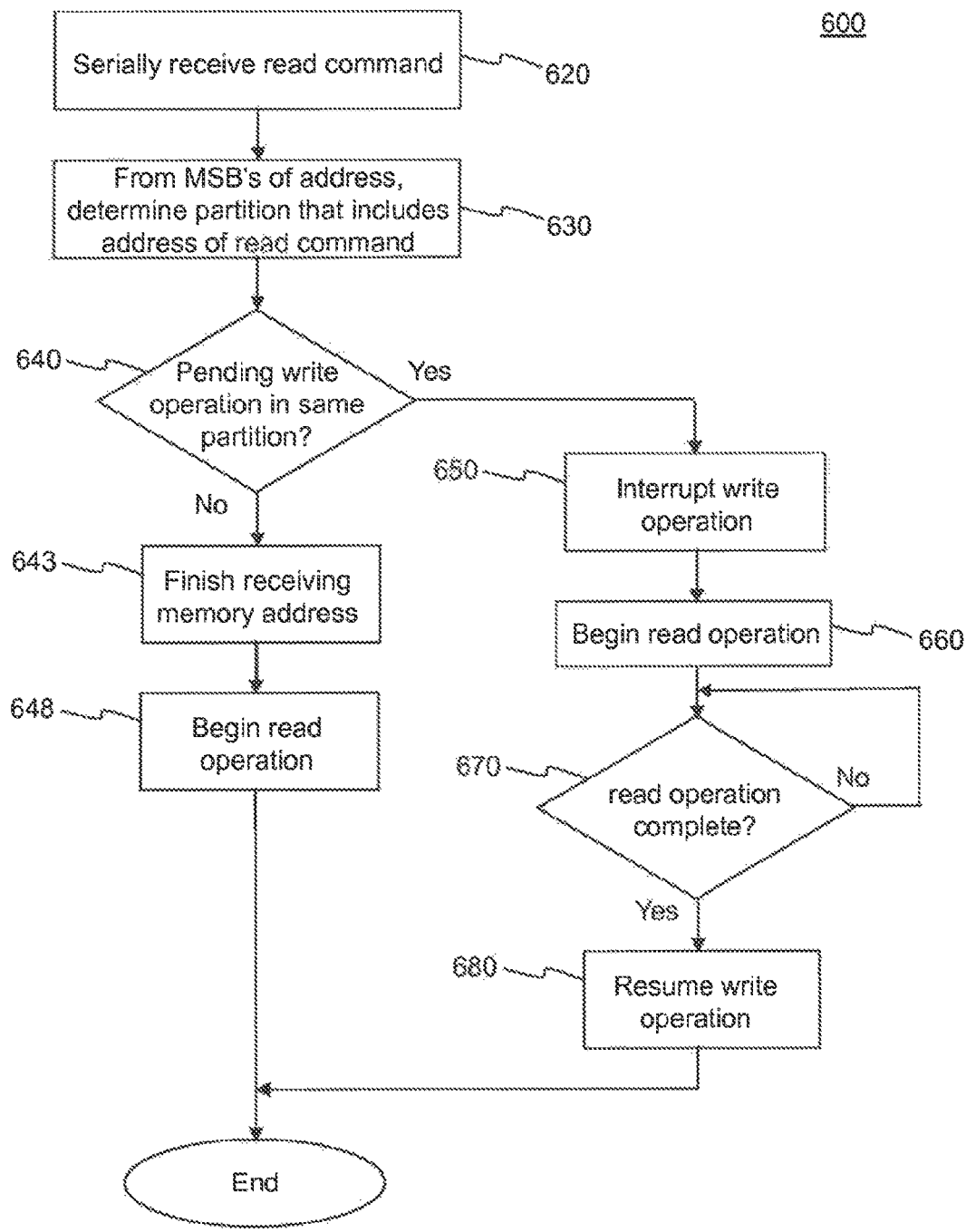
FIG. 6 is a flow diagram of a process to read from a partition of memory, according to an embodiment.

FIG. 6 is a flow diagram of a process 600 to read from a data partition of a memory array, according to an embodiment. Such a process may be performed using timing diagrams shown in FIGS. 3, 4, 5A, and 5B, for example, though claimed subject matter is not so limited. At block 620, a microcontroller may receive a read command, which may be provided by a memory controller and/or a processor, as described above, for example. In one implementation, such a microcontroller may be embedded within a memory device comprising the memory array. The microcontroller may receive an address portion of the read command serially, starting with a MSB of a memory address and continuing to receive remaining bits of the memory address until the LSB is received. Such an address portion may specify a target location of the memory array from where data is to be read. At block 630, the microcontroller may determine which partition includes the target location after receiving one or more MSBs of the memory address. For example, as described above, the microcontroller may determine which partition includes the target location after receiving three MSBs of the memory address. With knowledge of which partition includes the target location, the microcontroller may determine whether a write operation is occurring in the same partition, as at diamond 640. If no such write operation is occurring, process 600 may proceed to block 643, where the microcontroller may finish receiving remaining bits of the memory address. At block 648, the microcontroller may begin processes to read from the target memory location. For example, such processes may include internal sensing operations that may begin as soon as the microcontroller may identify the page that includes the target memory location of the read command, as described above. On the other hand, if such a write operation is occurring in the same partition as that of the target location, process 600 may proceed to block 650, where the microcontroller may begin a process to interrupt the write operation. For example, such a process of interrupting a write operation of a partition may comprise storing an address, restoring internal voltages to a read condition, and releasing control of the partition to read circuitry. The microcontroller may perform a concurrent process of receiving additional bits of the memory address and completing a write interrupt.

At block 660, the microcontroller may begin processes to read from the target memory location. For example, such processes may include internal sensing operations that may begin as soon as the microcontroller may identify the page that includes the target memory location of the read command, as described above. At diamond 670, a determination may be made as to whether the read operation is complete. If not, then process 600 may wait for such a read operation to finish. If the read operation is complete, process 600 may proceed to block 680, where the microcontroller may resume the write operation that was interrupted earlier. For example, such a process of resuming a write operation of a partition may comprise retrieving the stored address of the write operation, restoring internal voltages to a write condition, and releasing control of the partition to write circuitry. Of course, such details of process 600 are merely examples, and claimed subject matter is not so limited.

Figure 7:
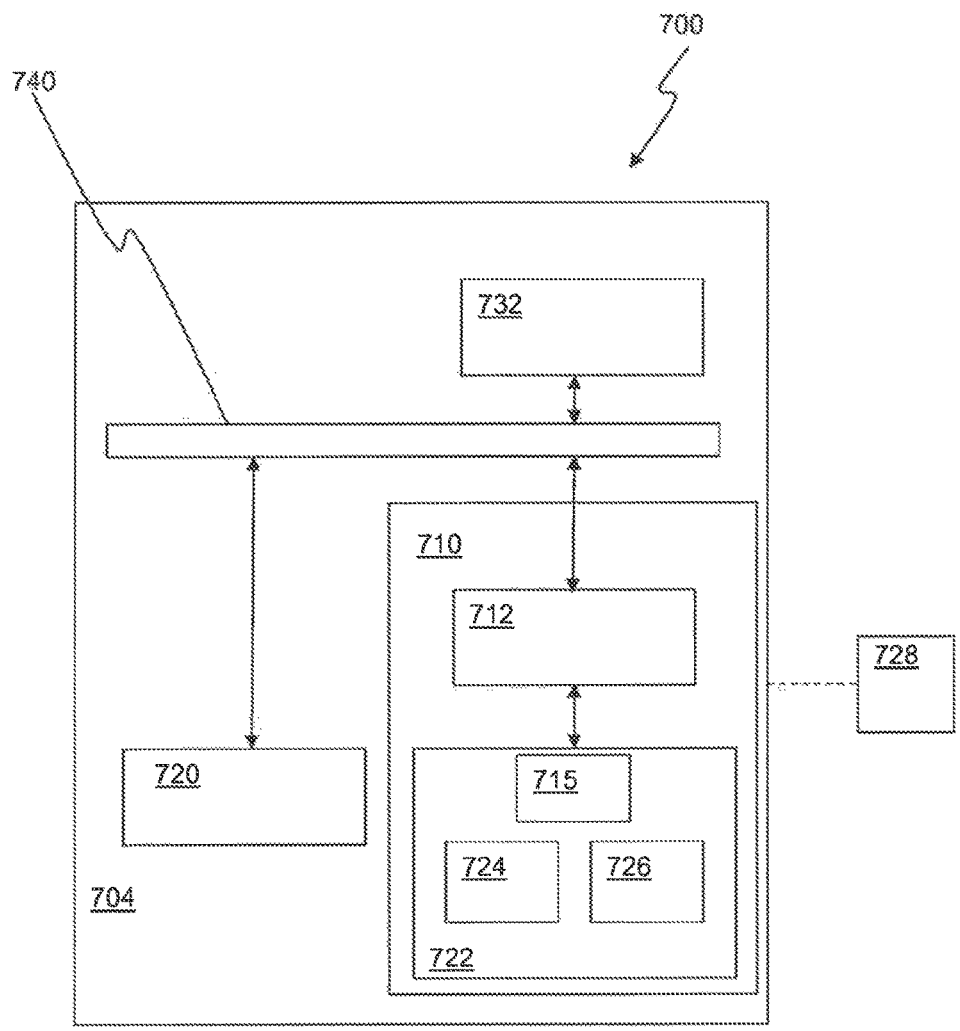
FIG. 7 is a schematic diagram illustrating an exemplary embodiment of a computing system.

FIG. 7 is a schematic diagram illustrating an exemplary embodiment of a computing system 700 including a memory device 710. Such a computing device may comprise one or more processors, for example, to execute an application and/or other code. For example, memory device 710 may comprise a number of data partitions, as shown in FIG. 2. A computing device 704 may be representative of any device, appliance, or machine that may be configurable to manage memory device 710. Memory device 710 may include a memory controller 712 and a memory 722. By way of example but not limitation, computing device 704 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof It is recognized that all or part of the various devices shown in system 700, and the processes and methods as further described herein, may be implemented using or otherwise including hardware, firmware, software, or any combination thereof. Thus, by way of example but not limitation, computing device 704 may include at least one processing unit 720 that is operatively coupled to memory 722 through a bus 740 and a host or memory controller 712. Processing unit 720 is representative of one or more circuits configurable to perform at least a portion of a data computing procedure or process. By way of example but not limitation, processing unit 720 may include one or more processors, controllers, microprocessors, microcontrollers, application specific integrated circuits, digital signal processors, programmable logic devices, field programmable gate arrays, and the like, or any combination thereof. Processing unit 720 may include an operating system configured to communicate with memory controller 712. Such an operating system may, for example, generate commands to be sent to memory controller 712 over bus 740. Such commands may comprise read and/or write commands. Memory device 710 may comprise a microcontroller 715 that may perform process 600 described above, for example, to perform a read process by interrupting an occurring write process in a same memory partition. Microcontroller 715 may be embedded in memory 722, such as on the same die that includes a memory array, for example.

Memory 722 is representative of any data storage mechanism. Memory 722 may include, for example, a primary memory array 724 and/or a secondary memory 726. Primary memory array 724 may include, for example, a random access memory, read only memory, etc. While illustrated in this example as being separate from processing unit 720, it should be understood that all or part of primary memory array 724 may be provided within or otherwise co-located/coupled with processing unit 720.

Secondary memory 726 may include, for example, the same or similar type of memory as primary memory and/or one or more data storage devices or systems, such as, for example, a disk drive, an optical disc drive, a tape drive, a solid state memory drive, etc. In certain implementations, secondary memory 726 may be operatively receptive of, or otherwise configurable to couple to, a computer-readable medium 728. Computer-readable medium 728 may include, for example, any medium that can carry and/or make accessible data, code, and/or instructions for one or more of the devices in system 700. Computing device 704 may include, for example, an input/output 732.

In a particular embodiment, computing system 700 may include a memory device comprising a memory array 724 and a microcontroller 715. Such a microcontroller may receive a read command including a first portion of a memory address of the memory array 724, and may interrupt a write operation being performed in a memory partition that corresponds to the first portion of the memory address. Such an interrupt of a write operation may be performed while receiving a second portion of the memory address. Computing system 700 may also include processing unit 720 to host one or more applications and to initiate read commands directed to microcontroller 715 to provide access to memory cells in memory array 724, for example.

Input/output 732 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 732 may include an operatively configured display, speaker, keyboard, mouse, trackball, touch screen, data port, etc.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
    identifying a first portion of a read command that includes a first portion of a memory address of a memory device, wherein the first portion of the memory address comprises a number of bits of the memory address;
    identifying a memory partition of the memory device based at least in part on the number of bits;
    determining that a write operation is being performed at the identified memory partition;
    interrupting the write operation in response to the determination that the write operation is being performed and identifying the first portion of the read command;
    identifying, after a start of the interruption and before a completion of the interruption, a second portion of the read command that includes a second portion of the memory address, wherein the second portion of the memory address comprises a remaining number of bits of the memory address, the remaining number of bits identifying one or more memory cells of the memory partition; and
    reading, after the completion of the interruption, the one or more memory cells indicated by the memory address.

2. The method of claim 1, wherein reading the one or more memory cells is initiated before identifying the second portion of the read command.

3. The method of claim 1, wherein the identifying the second portion of the read command and the interrupting the write operation occur during overlapping time intervals.

4. The method of claim 1, further comprising:
    receiving the first portion of the read command and the second portion of the read command serially.

5. The method of claim 1, wherein the first portion of the memory address comprises a most significant bit of the memory address, and the second portion of the memory address comprises a least significant bit of the memory address.

6. The method of claim 1, further comprising:
    resuming the write operation after reading the one or more memory cells indicated by the memory address.

7. The method of claim 1, further comprising:
    storing a memory address of the write operation based at least in part on the determination.

8. The method of claim 1, further comprising:
    receiving a command to initiate the write operation.

9. The method of claim 1, further comprising:
    determining to initiate the write operation based at least in part on an internal memory process of the memory device.

10. The method of claim 9, wherein the write operation comprises:
    a background operation, or a refresh operation, or a wear leveling operation, or a garbage collection operation, or a bad block management operation, or a combination thereof.

11. An apparatus, comprising:
    a memory array having a plurality of memory partitions, each of the plurality of memory partitions having a plurality of memory cells; and
    a microcontroller configured to:
    receive a read command;
    identify a first portion of the read command that includes a first portion of a memory address of the memory array, wherein the first portion of the memory address comprises a number of bits;
    identify one of the plurality of memory partitions based at least in part on the number of bits;
    determine that a write operation is being performed at the identified memory partition;
    interrupt the write operation in response to the determination that the write operation is being performed and identifying the first portion of the read command;
    identify, after a start of the interruption and before a completion of the interruption, a second portion of the read command that includes a second portion of the memory address, wherein the second portion of the memory address comprises a remaining number of bits of the memory address, the remaining number of bits identifying one or more memory cells of the memory partition; and
    access, after the completion of the interruption, the one or more memory cells indicated by the memory address.

12. The apparatus of claim 11, further comprising a read circuit, or a sense amplifier, or a row decode circuit, or a column decode circuit, or a combination thereof, that is dedicated to a memory partition.

13. The apparatus of claim 11, further comprising a memory controller configured to:
    generate the read command based at least in part on receiving a command from a processor separate from the apparatus; and
    provide the read command to the microcontroller.

14. The apparatus of claim 11, wherein the memory cells each comprise a phase change memory.

15. The apparatus of claim 11, wherein the microcontroller is configured to initiate reading the one or more memory cells before identifying the second portion of the read command.

16. The apparatus of claim 11, wherein the microcontroller is configured to identify the second portion of the read command and interrupt the write operation during overlapping time intervals.

17. The apparatus of claim 11, wherein the microcontroller is configured to receive the memory address in a sequence from a most significant bit of the memory address to a least significant bit of the memory address.

18. The apparatus of claim 11, further comprising a memory to store a memory address of the write operation based at least in part on the determination, wherein the microcontroller is configured to resume the write operation based at least in part on the stored memory address of the write operation.

19. The apparatus of claim 11, wherein the microcontroller is configured to:
   determine to initiate the write operation based at least in part on an internal memory process, receive a command to initiate the write operation, or both.

20. An apparatus comprising:
   a memory array; and
   a memory controller, the memory controller configured to:
   identify a first portion of a read command that references a first portion of a memory address of the memory array, wherein the first portion of the memory address comprises a number of bits;
   identify a portion of the memory array based at least in part on the number of bits;
   determine that a write operation is being performed at the identified portion of the memory array;
   interrupt the write operation in response to the determination that the write operation is being performed and identifying the first portion of the read command;
   identify, after a start of the interruption and before a completion of the interruption, a second portion of the read command that references a second portion of the memory address, wherein the second portion of the memory address comprises a remaining number of bits of the memory address, the remaining number of bits identifying a memory location of the indicated portion of the memory array; and
   read, after the completion of the interruption, from the memory location indicated by the memory address.

* * * * *